United States Patent
Chang et al.

(10) Patent No.: US 8,018,721 B2
(45) Date of Patent: Sep. 13, 2011

(54) ELECTRONIC DEVICE AND HEAT DISSIPATING MODULE THEREOF

(75) Inventors: Chin-Lien Chang, Taipei (TW); Ya-Chyi Chou, Taipei (TW); Ea-Si Lee, Taipei (TW); Perng-Kae Wang, Taipei (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 12/624,655

(22) Filed: Nov. 24, 2009

(65) Prior Publication Data

US 2010/0142147 A1 Jun. 10, 2010

(30) Foreign Application Priority Data

Dec. 10, 2008 (TW) .............................. 97148085 A

(51) Int. Cl.
*H05K 7/20* (2006.01)
*F28F 7/00* (2006.01)

(52) U.S. Cl. .............. 361/700; 361/379.47; 361/679.52; 165/80.4; 165/104.33; 174/15.2; 257/714

(58) Field of Classification Search .................. None
See application file for complete search history.

(56) References Cited

U.S. PATENT DOCUMENTS

| | | | | |
|---|---|---|---|---|
| 6,137,683 | A * | 10/2000 | Lee et al. | 361/704 |
| 6,166,907 | A | 12/2000 | Chien | |
| 6,359,780 | B1 * | 3/2002 | McMahan et al. | 361/679.47 |
| 6,752,645 | B2 | 6/2004 | Nakamura et al. | |
| 6,961,243 | B2 * | 11/2005 | Shih-Tsung | 361/700 |
| 6,966,363 | B2 * | 11/2005 | Gailus et al. | 165/185 |
| 6,989,990 | B2 * | 1/2006 | Malone et al. | 361/699 |
| 7,028,757 | B1 * | 4/2006 | Hegde | 165/104.21 |
| 7,231,961 | B2 * | 6/2007 | Alex et al. | 165/80.4 |
| 7,240,722 | B2 * | 7/2007 | Lai et al. | 165/104.33 |
| 7,385,818 | B2 * | 6/2008 | Heesen | 361/700 |
| 7,529,089 | B2 * | 5/2009 | Cheng | 361/699 |

(Continued)

FOREIGN PATENT DOCUMENTS

CN 2760756 2/2006

(Continued)

OTHER PUBLICATIONS

English translation of abstract of CN 1877828A, Dec. 13, 2006.
English translation of abstract of CN 101242732A, Aug. 13, 2008.
English language translation of abstract of CN 2760756 (published Feb. 22, 2006).

(Continued)

*Primary Examiner* — Boris L Chervinsky
(74) *Attorney, Agent, or Firm* — Thomas, Kayden, Horstemeyer & Risley, LLP

(57) ABSTRACT

An electronic device including a circuit board and a heat dissipating module is provided. The circuit board has a thermal source. The heat dissipating module is disposed on the thermal source and has a heat conducting unit, a first heat dissipating unit and a second heat dissipating unit. The heat conducting unit has a heat conducting plate and a heat pipe. A first surface of the heat conducting plate contacts the thermal source. A first end of the heat pipe is connected to the heat conducting plate. The first heat dissipating unit is connected to a second end of the heat pipe. The second heat dissipating unit is movably disposed on a second surface of the heat conducting plate. The heat dissipating module in the invention can achieve the dual thermal dissipation efficiency via the different cooling modes so as to satisfy the heat dissipating requirement of high speed processors.

16 Claims, 4 Drawing Sheets

U.S. PATENT DOCUMENTS

| | | | | |
|---|---|---|---|---|
| 7,613,001 B1 * | 11/2009 | Liu et al. | | 361/700 |
| 7,701,708 B2 * | 4/2010 | Wu et al. | | 361/679.47 |
| 7,775,262 B2 * | 8/2010 | Liu et al. | | 165/104.26 |

FOREIGN PATENT DOCUMENTS

| | | | |
|---|---|---|---|
| CN | 1877828 | A | 12/2006 |
| CN | 101242732 | A | 8/2008 |
| TW | 00575279 | | 11/1991 |
| TW | I256874 | | 5/1993 |
| TW | M302243 | | 5/1995 |
| TW | M323646 | | 6/1996 |

OTHER PUBLICATIONS

English language translation of abstract of TW M302243, May 6, 1995.

English language translation of abstract of TW M323646, Jun. 21, 1996.

English language translation of abstract of TW 00575279, Nov. 21, 1991.

English language translation of abstract of TW I256874, May 10, 1993.

* cited by examiner

ELECTRONIC DEVICE AND HEAT DISSIPATING MODULE THEREOF

CROSS REFERENCE TO RELATED APPLICATIONS

This Non-provisional application claims priority under 35 U.S.C. §119(a) on Patent Application No(s). 097148085 filed in Taiwan, Republic of China on Dec. 10, 2008, the entire contents of which are hereby incorporated by reference.

BACKGROUND OF THE INVENTION

1. Field of Invention

The invention relates to an electronic device and a heat dissipating module thereof.

2. Related Art

With the progress of the science and technology, the processing speed of various electronic devices is more and more fast. However, correspondingly, heat generated by various chips in the electronic devices also becomes more. Therefore, manufacturers pay more and more attention to the heat dissipating technique corresponding to different chips. The electronic device with a circuit board herein is taken as an example to illustrate the heat dissipating mode of a north bridge chip on the circuit board.

As shown in FIG. 1, it is a side view diagram showing a circuit board of a conventional electronic device. The electronic device 1 has a circuit board 11, a north bridge chip 12, a heat conducting plate 13 and a heat dissipating fin 14. The north bridge chip 12 is disposed on the circuit board 11. The heat conducting plate 13 is connected to the north bridge chip 12, and the heat dissipating fin 14 contacts the heat conducting plate 13 and is locked with the circuit board 11.

Therefore, the heat conducting plate 13 may be used to conduct heat generated by the north bridge chip 12 to the heat dissipating fin 14, and the heat dissipating fin 14 is an air cooling heat dissipating unit which dissipates heat by heat convection of the air.

However, the heat dissipating fin 14 on the conventional circuit board 1 is connected to the circuit board 11 in a locking mode. Therefore, when a user wants to reassemble a water cooling heat dissipating unit (not shown) to improve the heat dissipating efficiency, he or she needs to detach the heat dissipating fin 14 before disposing the water cooling heat dissipating unit on the heat conducting plate 13. Thus, the heat only may be dissipated by one of the air cooling heat dissipating unit (the heat dissipating fin 14) and the water cooling heat dissipating unit, and this may not satisfy the heat dissipating requirement of the high speed processor. In addition, the user also may feel it inconvenient to replace the heat dissipating fin 14 with the water cooling heat dissipating unit. Furthermore, if the replaced heat dissipating fin 14 has no other use, it may become wasted.

SUMMARY OF THE INVENTION

An objective of the invention is to provide an electronic device having both a first heat dissipating unit and a second heat dissipating unit and a heat dissipating module thereof. Thus, the dual thermal dissipation efficiency is achieved via different cooling modes.

To achieve the objective above, the heat dissipating module of an electronic device in the invention is disposed on a thermal source of a circuit board. The heat dissipating module includes a heat conducting unit, a first heat dissipating unit and a second heat dissipating unit. The heat conducting unit has a heat conducting plate and a heat pipe. A first surface of the heat conducting plate contacts the thermal source, and a first end of the heat pipe is connected to the heat conducting plate. The first heat dissipating unit is connected to a second end of the heat pipe, and the second heat dissipating unit is movably disposed on a second surface of the heat conducting plate.

To achieve the objective above, the electronic device according to the invention includes a circuit board and a heat dissipating module. The circuit board has a thermal source, and the heat dissipating module is disposed on the thermal source. The heat dissipating module has a heat conducting unit, a first heat dissipating unit and a second heat dissipating unit. The heat conducting unit has a heat conducting plate and a heat pipe. A first surface of the heat conducting plate contacts the thermal source, and a first end of the heat pipe is connected to the heat conducting plate. The first heat dissipating unit is connected to a second end of the heat pipe, and the second heat dissipating unit is movably disposed on a second surface of the heat conducting plate.

In a preferable embodiment of the invention, the first heat dissipating unit rotates relative to the heat conducting plate around the second end. Thus, the first heat dissipating unit and the second heat dissipating unit do not interfere with each other in the space.

In the preferable embodiment of the invention, the second heat dissipating unit is connected to the heat conducting plate in a sticking mode, a fastening mode, a screwing mode, a locking mode, an engaging mode, a welding mode or an assembly of these modes. Thus, the second heat dissipating unit may contact the thermal source directly.

In a preferable embodiment of the invention, heat generated by the thermal source is conducted to the first heat dissipating unit to be dissipated indirectly via the heat pipe.

In addition, in the electronic device and the heat dissipating module thereof of the invention, the first heat dissipating unit is connected to the heat conducting plate via the heat pipe. The second heat dissipating unit contacts the second surface of the heat conducting plate relative to the thermal source. Thus, heat generate by the thermal source may be dissipated by the first heat dissipating unit via the heat conducting plate and the heat pipe, and it also may be dissipated via the heat conducting plate and the second heat dissipating unit. The heat dissipating module in the invention may achieve the dual thermal dissipation efficiency via different cooling modes, and this satisfies the heat dissipating requirement of the high speed processors.

These and other features, aspects and advantages of the present invention will become better understood with regard to the following description, appended claims, and accompanying drawings.

DETAILED DESCRIPTION OF THE INVENTION

Referring to the relative drawings, the electronic device and the heat dissipating module thereof in a preferable embodiment of the invention are illustrated hereinbelow. The same elements are denoted by the same symbols.

Figure 1:
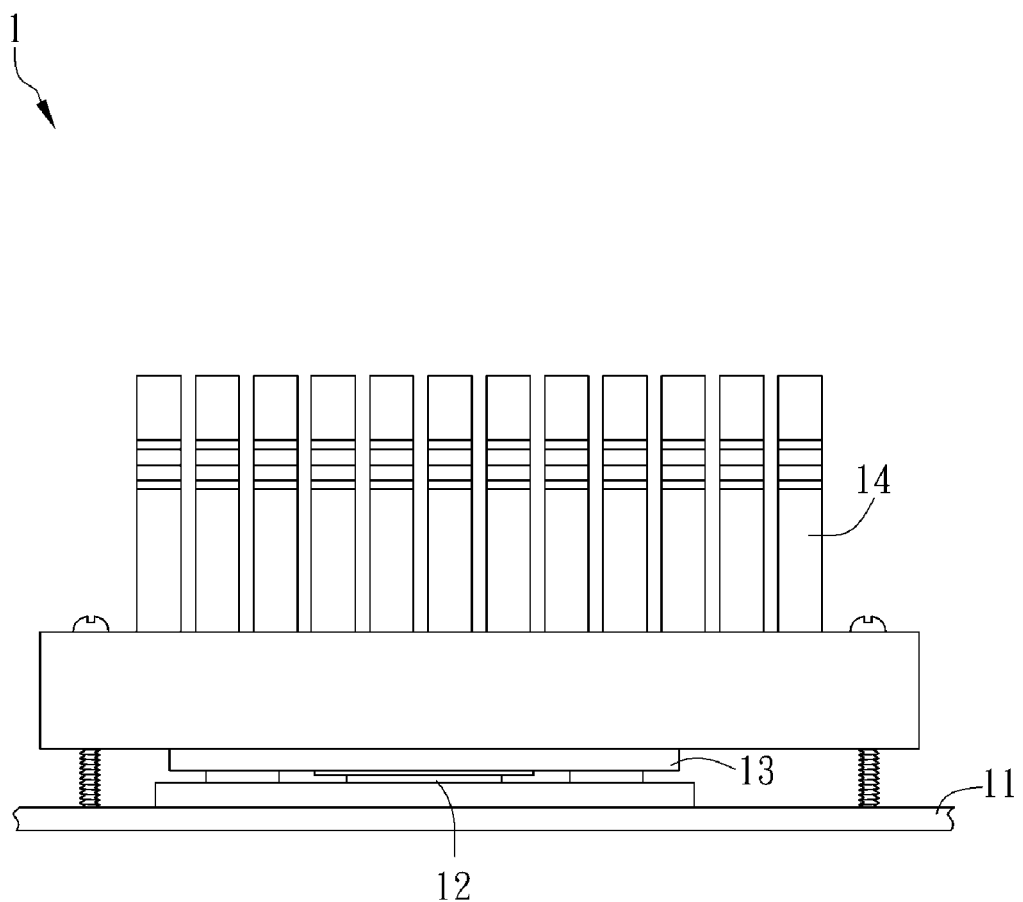
FIG. 1 is a side view diagram showing a circuit board of a conventional electronic device.
Figure 2:
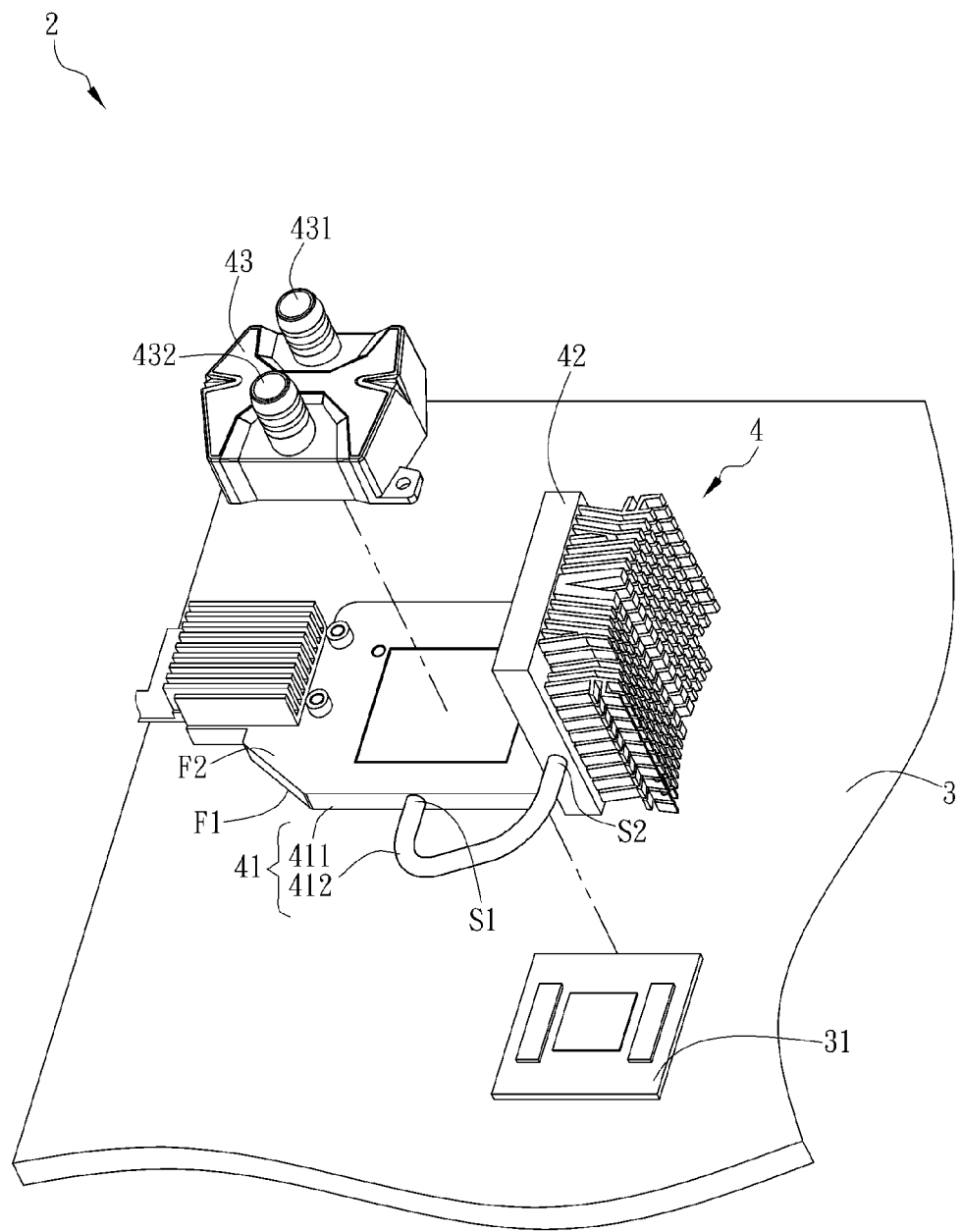
FIG. 2 is an exploded diagram showing the electronic device and the heat dissipating module thereof according to a preferable embodiment of the invention.

As shown in FIG. 2, it is an exploded diagram showing the heat dissipating module 4 of the electronic device 2 according to a preferable embodiment of the invention. The electronic device 2 is, for example, a notebook computer, a desktop computer or a game device, and it is not limited thereto. The electronic device 2 includes a circuit board 3 and a heat dissipating module 4.

The circuit board 3 has a thermal source 31. The thermal source 31 is, for example, a central processing unit (CPU) disposed on the circuit board 3, a north bridge chip, a display chip, a graphics chip or one of other high speed processors.

The heat dissipating module 4 is disposed on the thermal source 31 of the circuit board 3 to dissipate heat generated by the thermal source 31. The heat dissipating module 4 has a heat conducting unit 41, a first heat dissipating unit 42 and a second heat dissipating unit 43.

The heat conducting unit 41 has a heat conducting plate 411 and a heat pipe 412. A first surface F1 of the heat conducting plate 411 contacts the thermal source 31. A first end S1 of the heat pipe 412 is connected to the heat conducting plate 411. The heat conducting plate 411 and the heat pipe 412 are made of aluminum, copper or other materials having high heat conducting property.

The first heat dissipating unit 42 is connected to a second end S2 of the heat pipe 412. The first heat dissipating unit 42 is, for example, a heat dissipating plate, a heat dissipating fin or an assembly of a heat dissipating plate and a heat dissipating fin. In the embodiment, the first heat dissipating unit 42 is, for example, an extruded heat dissipating fin. However, the assembly of the first heat dissipating unit in the embodiment is not limited.

The second heat dissipating unit 43 is movably disposed on a second surface F2 of the heat conducting plate 411 relative to the thermal source 31. The second heat dissipating unit 43 is, for example, a liquid cooling unit which may be a water cooling unit or an oil cooling unit. The second heat dissipating unit 43 is connected to the heat conducting plate 411 in a sticking mode, a fastening mode, a screwing mode, a locking mode, an engaging mode, a welding mode or an assembly of these modes. In the embodiment, the second heat dissipating unit 43 is connected to the heat conducting plate 411 in a locking mode, and it is not limited in the invention.

Heat generated by the thermal source 31 is conducted to the first heat dissipating unit 42 to be dissipated via the heat conducting plate 411 and the heat pipe 412, and it also may be conducted to the second heat dissipating unit 43 via the heat conducting plate 411 to be dissipated via the cooling liquid flowing to the second heat dissipating unit 43. Thus, the heat dissipating module 4 of the electronic device 2 may achieve the dual thermal dissipation efficiency. The cooling liquid flows into the second heat dissipating unit 43 via the fluid entrance 431 and then flows out of the second heat dissipating unit 43 via the fluid exit 432.

Figure 3:
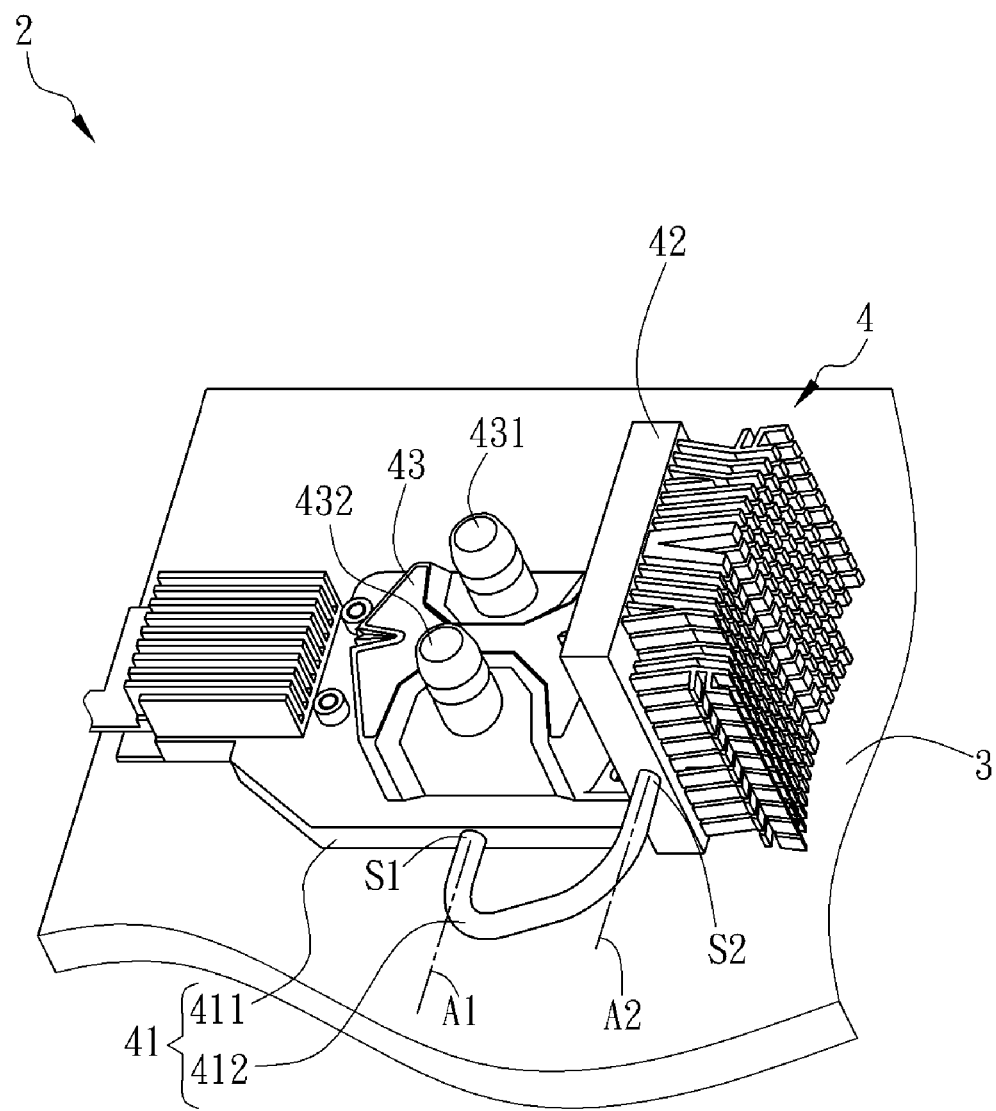
FIG. 3 is a combination diagram showing the electronic device and the heat dissipating module thereof in FIG. 2.
Figure 4:
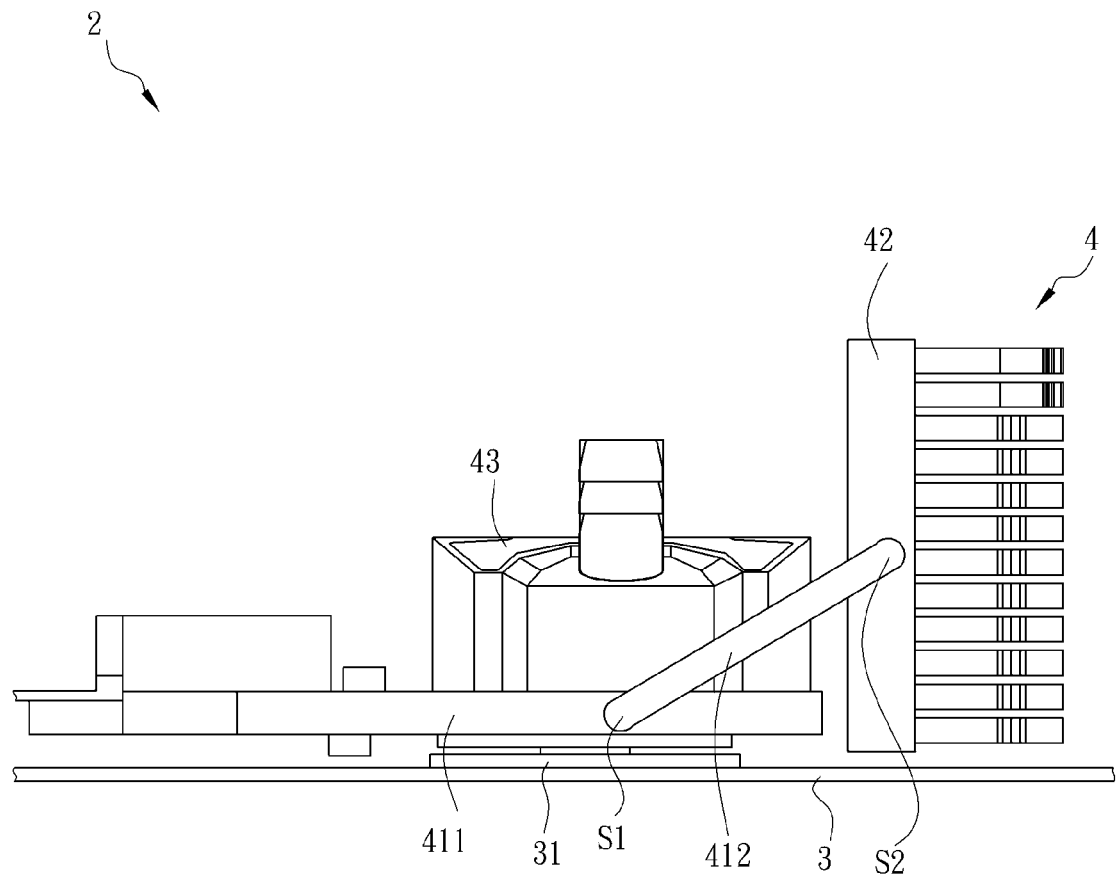
FIG. 4 is a side view diagram showing the electronic device and the heat dissipating module thereof in FIG. 3.

As shown in FIG. 3 and FIG. 4, FIG. 3 is a combination diagram showing the electronic device 2 and the heat dissipating module 4 thereof in the embodiment. FIG. 4 is a side view of FIG. 3. In the embodiment, the first heat dissipating unit 42 of the heat dissipating module 4 of the electronic device 2 may movably rotate relative to the heat conducting plate 411, and it is not limited thereto. The first heat dissipating unit 42 may keep close to the second surface F2 of the first heat conducting plate 411 movably. In other words, before the second heat dissipating unit 43 is assembled, the first heat dissipating unit 42 may rotate to keep close to the second surface F2 of the heat conducting plate 411. Thus, the first heat dissipating unit 42 may be rotated to change the position in the space to adjust the position to be disposed in the electronic device which has a small space. In another aspect, the second heat dissipating unit 43 may be disposed on the heat conducting plate 411, and heat from the thermal source 31 may be dissipated via different cooling modes (air cooling or liquid cooling mode) to achieve the dual thermal dissipation efficiency.

First, the user needs to detach the fixing components (such as screws, not shown) for fixing the first heat dissipating unit 42 on the heat conducting plate 411. Then, the first end S1 of the heat pipe 412 is considered as a first pivot A1, and the first heat dissipating unit 42 rotates relative to the heat conducting plate 411 around the first pivot A1. In other words, the heat pipe 412 may be considered as a hinge of the first heat dissipating unit 42 when the first heat dissipating unit 42 rotates. After rotating, the first heat dissipating unit 42 should not interfere with the second heat dissipating unit 43 or other components. Then, the second heat dissipating unit 43 is disposed on the original position of the first heat dissipating unit 42 via the fixing components.

In addition, the second end S2 of the heat pipe 412 may be considered as a second pivot A2, and the first heat dissipating unit 42 also may rotate around the second end S2 of the heat pipe 412. In other words, the first heat dissipating unit 42 may rotate relative to the heat conducting plate 411, and it also may rotate relative to the heat pipe 412.

Furthermore, to make the heat conducting more efficient, the thermal source 31 should keep close to the heat conducting plate 411, and the heat conducting plate 411 should keep close to the second heat dissipating unit 43. Heat conducting materials (such as the heat dissipating paste or glue) may fill the gap between them. In addition, heat dissipating plates and heat dissipating sheets also may be disposed to keep the heat dissipating path unimpeded.

To sum up, in the electronic device and the heat dissipating module thereof in the invention, the first heat dissipating unit (such as the heat dissipating plate, the heat dissipating sheet or the heat dissipating fin) is connected to the heat conducting plate via the heat pipe. The second heat dissipating unit (such as the water cooling unit and the oil cooling unit) contacts the second surface of the heat conducting plate relative to the thermal source. Thus, heat generated by the thermal source may be dissipated by the first heat dissipating unit via the heat conducting plate and the heat pipe, and it also may be dissipated by the heat conducting plate and the second heat dissipating unit. The heat dissipating module in the invention may achieve the dual thermal dissipation efficiency via different cooling modes. Thus, the heat dissipating requirement of the high speed processor is satisfied.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A heat dissipating module disposed on a thermal source of a circuit board, comprising:
   a heat conducting unit having a heat conducting plate and a heat pipe, wherein a first surface of the heat conducting plate contacts the thermal source, and a first end of the heat pipe is connected to the heat conducting plate;
   a first heat dissipating unit connected to a second end of the heat pipe, wherein the first heat dissipating unit rotates around the second end; and
   a second heat dissipating unit movably disposed on a second surface of the heat conducting plate.

2. The heat dissipating module according to claim 1, wherein the first heat dissipating unit rotates relative to the heat conducting plate around the first end.

3. The heat dissipating module according to claim 2, wherein the first heat dissipating unit rotates around the first end and is movably close to the second surface of the heat conducting plate.

4. The heat dissipating module according to claim 1, wherein the first heat dissipating unit is a heat dissipating plate, a heat dissipating fin or an assembly of a heat dissipating plate and a heat dissipating fin.

5. The heat dissipating module according to claim 1, wherein the second heat dissipating unit is a liquid cooling unit.

6. The heat dissipating module according to claim 5, wherein the liquid cooling unit is a water cooling unit or an oil cooling unit.

7. The heat dissipating module according to claim 1, wherein the second heat dissipating unit is connected to the heat conducting plate in a sticking mode, a fastening mode, a screwing mode, a locking mode, an engaging mode, a welding mode or an assembly of these modes.

8. The heat dissipating module according to claim 1, wherein the second heat dissipating unit has a fluid entrance and a fluid exit, and cooling fluid flows into the second heat dissipating unit via the fluid entrance and then flows out of the second heat dissipating unit via the fluid exit.

9. An electronic device comprising:
   a circuit board having a thermal source; and
   a heat dissipating module disposed on the thermal source, wherein the heat dissipating module includes:
      a heat conducting unit having a heat conducting plate and a heat pipe, wherein a first surface of the heat conducting plate contacts the thermal source, and a first end of the heat pipe is connected to the heat conducting plate;
      a first heat dissipating unit connected to a second end of the heat pipe, wherein the first heat dissipating unit rotates around the second end; and
      a second heat dissipating unit movably disposed on a second surface of the heat conducting plate.

10. The electronic device according to claim 9, wherein the first heat dissipating unit rotates relative to the heat conducting plate around the first end.

11. The electronic device according to claim 10, wherein the first heat dissipating unit rotates around the first end and is movably close to the second surface of the heat conducting plate.

12. The electronic device according to claim 9, wherein the first heat dissipating unit is a heat dissipating plate, a heat dissipating fin or an assembly of a heat dissipating plate and a heat dissipating fin.

13. The electronic device according to claim 9, wherein the second heat dissipating unit is a liquid cooling unit.

14. The electronic device according to claim 13, wherein the liquid cooling unit is a water cooling unit or an oil cooling unit.

15. The electronic device according to claim 9, wherein the second heat dissipating unit is connected to the heat conducting plate in a sticking mode, a fastening mode, a screwing mode, a locking mode, an engaging mode, a welding mode or an assembly of these modes.

16. The electronic device according to claim 9, wherein the second heat dissipating unit has a fluid entrance and a fluid exit, and cooling fluid flows into the second heat dissipating unit via the fluid entrance and then flows out of the second heat dissipating unit via the fluid exit.

* * * * *